(12) United States Patent
Katsuda et al.

(10) Patent No.: US 11,011,404 B2
(45) Date of Patent: May 18, 2021

(54) CERAMIC STRUCTURE, MEMBER FOR SUBSTRATE-HOLDING APPARATUS, AND METHOD FOR PRODUCING THE CERAMIC STRUCTURE

(71) Applicant: NGK INSULATORS, LTD., Nagoya (JP)

(72) Inventors: Yuji Katsuda, Nagoya (JP); Noboru Nishimura, Tsushima (JP)

(73) Assignee: NGK Insulators, Ltd., Nagoya (JP)

(*) Notice: Subject to any disclaimer, the term of this patent is extended or adjusted under 35 U.S.C. 154(b) by 525 days.

(21) Appl. No.: 15/401,199

(22) Filed: Jan. 9, 2017

(65) Prior Publication Data

US 2017/0117175 A1 Apr. 27, 2017

Related U.S. Application Data

(63) Continuation of application No. PCT/JP2015/072968, filed on Aug. 14, 2015.

(30) Foreign Application Priority Data

Sep. 16, 2014 (JP) .............................. JP2014-187868

(51) Int. Cl.
*H01L 21/683* (2006.01)
*H01T 23/00* (2006.01)
(Continued)

(52) U.S. Cl.
CPC .......... *H01L 21/6833* (2013.01); *B32B 15/04* (2013.01); *B32B 18/00* (2013.01);
(Continued)

(58) Field of Classification Search
CPC .......... H01L 21/6833; H01L 21/68757; H01L 21/6831; H01L 21/67103; B32B 37/06; B32B 15/04; B32B 18/00; B32B 37/10
(Continued)

(56) References Cited

U.S. PATENT DOCUMENTS 4,952,902 A * 8/1990 Kawaguchi ............ H01C 7/042
252/516
5,011,554 A * 4/1991 Fleischer .................. C22C 5/04
148/430

(Continued)

FOREIGN PATENT DOCUMENTS

JP 07-297265 A1 11/1995
JP 10-221288 A1 8/1998

(Continued)

OTHER PUBLICATIONS

English Translation of International Preliminary Report on Patentability, International Application No. PCT/JP2015/072968, dated Mar. 30, 2017 (6 pages).

(Continued)

*Primary Examiner* — Jared Fureman
*Assistant Examiner* — Lucy M Thomas
(74) *Attorney, Agent, or Firm* — Burr & Brown, PLLC

(57) ABSTRACT

The ceramic structure 10 includes a discoid ceramic base 12 and an electrode 14 buried in the ceramic base 12. The ceramic base 12 is a sintered body composed principally of alumina or a rare-earth metal oxide and has a thermal expansion coefficient of 7.5 to 9.5 ppm/K over the range of 40° C. to 1200° C. The electrode 14 is composed principally of metal ruthenium. The electrode 14 may be formed in the shape of a sheet. Alternatively, the electrode 14 may be patterned in the manner of a one-stroke sketch so as to extend over the entire cross section of the ceramic base 12.

10 Claims, 2 Drawing Sheets

(51) Int. Cl.
| | |
|---|---|
| *C04B 35/50* | (2006.01) |
| *H01L 21/687* | (2006.01) |
| *C04B 37/00* | (2006.01) |
| *C04B 35/626* | (2006.01) |
| *C04B 35/111* | (2006.01) |
| *C04B 35/10* | (2006.01) |
| *B32B 15/04* | (2006.01) |
| *B32B 18/00* | (2006.01) |
| *B32B 37/06* | (2006.01) |
| *B32B 37/10* | (2006.01) |
| *C04B 35/505* | (2006.01) |
| *C04B 37/02* | (2006.01) |
| *H01L 21/67* | (2006.01) |

(52) U.S. Cl.
CPC .............. *B32B 37/06* (2013.01); *B32B 37/10* (2013.01); *C04B 35/10* (2013.01); *C04B 35/111* (2013.01); *C04B 35/50* (2013.01); *C04B 35/505* (2013.01); *C04B 35/6261* (2013.01); *C04B 37/001* (2013.01); *C04B 37/006* (2013.01); *C04B 37/02* (2013.01); *H01L 21/68757* (2013.01); B32B 2311/00 (2013.01); B32B 2315/02 (2013.01); B32B 2457/00 (2013.01); C04B 2235/3206 (2013.01); C04B 2235/3217 (2013.01); C04B 2235/3224 (2013.01); C04B 2235/3225 (2013.01); C04B 2235/445 (2013.01); C04B 2235/5409 (2013.01); C04B 2235/5445 (2013.01); C04B 2235/604 (2013.01); C04B 2235/658 (2013.01); C04B 2235/6562 (2013.01); C04B 2235/6565 (2013.01); C04B 2235/72 (2013.01); C04B 2235/9607 (2013.01); C04B 2237/12 (2013.01); C04B 2237/34 (2013.01); C04B 2237/343 (2013.01); C04B 2237/40 (2013.01); C04B 2237/68 (2013.01); H01L 21/67103 (2013.01); H01L 21/6831 (2013.01)

(58) Field of Classification Search
USPC ......................................................... 361/234
See application file for complete search history.

(56) References Cited

U.S. PATENT DOCUMENTS

| | | | |
|---|---|---|---|
| 6,108,190 A | | 8/2000 | Nagasaki |
| 7,446,284 B2* | | 11/2008 | Fan .................. H01L 21/67011 |
| | | | 118/500 |
| 2007/0138601 A1 | | 6/2007 | Fan et al. |
| 2008/0006204 A1 | | 1/2008 | Rusinko et al. |
| 2010/0104892 A1 | | 4/2010 | Kobayashi et al. |
| 2010/0213433 A1* | | 8/2010 | Yamamoto ......... G11C 13/0007 |
| | | | 257/4 |
| 2011/0063771 A1* | | 3/2011 | Nishioka ............... C04B 35/053 |
| | | | 361/234 |
| 2012/0248716 A1* | | 10/2012 | Nobori .................. C04B 35/645 |
| | | | 279/128 |
| 2013/0256297 A1 | | 10/2013 | Nobori et al. |
| 2014/0285943 A1* | | 9/2014 | Watanabe ........... H01L 21/6833 |
| | | | 361/234 |
| 2014/0290863 A1 | | 10/2014 | Watanabe et al. |
| 2015/0340609 A1* | | 11/2015 | Banno ................. H01L 45/1206 |
| | | | 257/4 |
| 2017/0251524 A1* | | 8/2017 | Atsuji ................... C04B 37/001 |

FOREIGN PATENT DOCUMENTS

| | | |
|---|---|---|
| JP | 11-163109 A1 | 6/1999 |
| JP | 2007-173828 A1 | 7/2007 |
| JP | 2008-016795 A1 | 1/2008 |
| JP | 2010-248054 A1 | 11/2010 |
| JP | 2013-229310 A1 | 11/2013 |
| TW | 200737400 A | 10/2007 |
| WO | 2013/054806 A1 | 4/2013 |

OTHER PUBLICATIONS

International Search Report and Written Opinion (Application No. PCT/JP2015/072968) dated Oct. 27, 2015.
Japanese Office Action (Application No. 2015-557260) dated Feb. 23, 2016.
Taiwanese Office Action, Taiwanese Application No. 20150126954, dated Jan. 17, 2019 (7 pages).
Chinese Office Action (with English translation), Chinese Application No. 201580037418.2, dated Jul. 1, 2019 (15 pages).

* cited by examiner

CERAMIC STRUCTURE, MEMBER FOR SUBSTRATE-HOLDING APPARATUS, AND METHOD FOR PRODUCING THE CERAMIC STRUCTURE

BACKGROUND OF THE INVENTION

1. Field of the Invention

The present invention relates to a ceramic structure, a member tor a substrate-holding apparatus, and a method fear producing the ceramic structure.

2. Description of the Related Art

Substrate-holding apparatuses have been widely used when elements and devices, such as semiconductors, are produced from tabular materials such as a silicon substrate, a glass substrate, and various single-crystal substrates by precision patterning. Various types of substrate-holding apparatuses are known. Examples thereof include an electrostatic chuck and a vacuum chuck that are capable of adsorbing a substrate thereon; a heater capable of heating a substrate; and a substrate-holding apparatus that includes both the electrostatic or vacuum chuck and the heater. In particular, the electrostatic chuck and the heater include a base having a surface on which a substrate is to be held and an electrode composed of a conducting substance which is buried in the base in a specific pattern. Thus, the electrostatic chuck and the heater are capable of generating an electrostatic force, Joule's heat for heating, and the like.

For example, PTL 1 discloses an electrostatic chuck that includes a ceramic base and an electrode buried in the ceramic base. It is described that, the ceramic base is composed of aluminium oxide, aluminium nitride, silicon nitride, silicon oxide, zirconium oxide, titanium oxide, sialon, boron nitride, silicon, carbide, and a mixture of the above compounds. It is described that the electrode is composed of a metal such as aluminium, iron, copper, silver, gold, titanium, tungsten, molybdeum, and platinum; a graphite or a carbon; a ceramic such as silicon carbide, titanium nitride, and titanium carbide; and a mixture of the above substances.

CITATION LIST

Patent Literature

JP 07-297265 A

SUMMARY OF THE INVENTION

There has recently been a demand for a reduction in the thickness of a substrate-holding apparatus that includes a ceramic base composed principally of alumina or a rare-earth oxide. However, such a substrate-holding apparatus may become warped due to the difference in thermal expansion between the ceramic base and the electrode when being produced by, for example, merging the ceramic base with, the electrode into one piece by firing at a high temperature since the thickness of the substrate-holding apparatus is small.

The present invention was made in order to address the above-described issue. A main object of the present invention is to provide a ceramic structure that includes a ceramic, base composed principally of alumina or a rare-earth metal oxide and an electrode disposed on the surface of the ceramic base or buried in the ceramic base, the ceramic structure having resistance to becoming warped at the time of production.

The ceramic structure according to the present invention includes a ceramic base, the principal component of the ceramic base being alumina or a rare-earth metal oxide, and an electrode disposed on the surface of the ceramic base or buried in the ceramic base. The ceramic base has a thermal expansion coefficient of 7.5 to 9.5 ppm/K over the range of 40° C. to 1200° C., The principal component of the electrode is metal ruthenium. The term "principal component" used herein refers to a component having a volume percent of 50 vol % or more or a component having the highest, volume percent, among all components.

The member for a substrate-holding apparatus according to the present invention includes the above-described ceramic structure.

A method for producing a ceramic structure according to the present invention includes disposing an electrode or an electrode precursor on a surface of a first base, the principal, component of the electrode or the electrode precursor being metal ruthenium, the first base being a compact, a calcined body, or a sintered body, the principal component of the first base being alumina or a rare-earth metal oxide; stacking a second base on the first base so as to form a laminated body, the second base being a compact, a calcined body, or a sintered body, the principal component of the second base being the same oxide as that included in the first base; and firing the laminated body by hot pressing in order to form a ceramic structure.

In the ceramic structure according to the present invention, the thermal expansion coefficient of the ceramic over the range of 40° C. to 1200° C. is 7.5 to 9.5 ppm/K, while the thermal expansion coefficient of: metal ruthenium, which is the principal component of the electrode, is 7.9 ppm/K over the range of 40° C. to 1200° C. Thus, the difference in thermal expansion coefficient between the ceramic base and the electrode is small. This reduces the warpage of the ceramic structure according to the present invention which occurs when the ceramic base and the electrode are merged with each other into one piece by being fired at a high temperature at the time of production.

The member for a substrate-holding apparatus according to the present invention, which includes the above-described ceramic structure, has the same advantageous effects as the ceramic structure.

The method for producing a ceramic structure according to the present invention is suitable for producing the above-described ceramic structure.

DETAILED DESCRIPTION OF THE INVENTION

Figure 1:
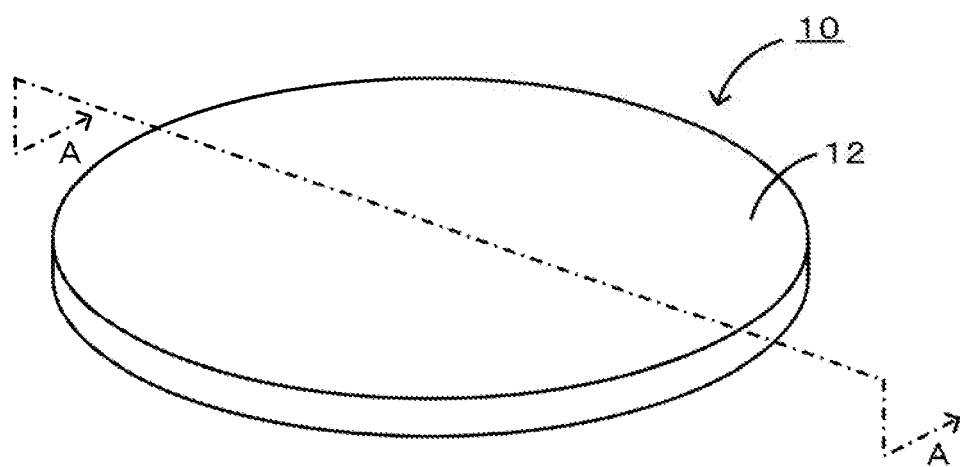
FIG. 1 is a perspective view of a ceramic structure 10.

A ceramic structure according to the present invention includes a ceramic base and an electrode disposed on the surface of the ceramic base or buried in the ceramic base.

The ceramic base is a sintered body composed principally of alumina or a rare-earth metal oxide. The thermal expansion coefficient of the ceramic base over the range of 40° C. to 1200° C. is 7.5 to 9.5 ppm/K and is preferably 8 to 9 ppm/K. When the principal component of the ceramic base is alumina, the ceramic base may include, in addition to alumina, a component that originates from a sintering aid. Examples of a sintering aid for alumina include alkaline-earth metal fluorides (e.g., $MgF_2$ and $CaF_2$) and alkaline-earth metal oxides (such as MgO and CaO). In the case where an alkaline-earth metal fluoride is used as a sintering aid for alumina, a part of the alkaline-earth metal fluoride remains after sintering and serves as a constituent phase of the ceramic structure, and another part of the alkaline-earth metal fluoride is converted into an oxyfluoride by reaction. In the case where an alkaline-earth metal oxide is used, as a sintering aid for alumina, a substance produced by the reaction of the oxide with alumina serves as a principal constituent phase of the ceramic base after sintering. For example, in the case where MgO is used as a sintering aid for alumina, the constituent phases of the resulting ceramic base includes $MgAl_2O_4$. When the principal component of the ceramic base is a rare-earth metal oxide, the ceramic base may include, in addition to the rare-earth metal oxide, a component that originates from a sintering aid. Examples of a sintering aid for rare-earth metal oxides include rare-earth metal and alkaline-earth metal fluorides (e.g., $YF_3$, $YbF_3$, and $CaF_2$).

The electrode is composed principally of metal ruthenium. Since the thermal expansion coefficient of metal ruthenium over the range of 40° C. to 1200° C. is 7.9 ppm/K, the absolute value of the difference in the thermal expansion coefficient over the range of 40° C. to 120° C. between the ceramic base and the electrode is small. Metal ruthenium has a low resistivity of $6 \times 10^{-6}$ to $10 \times 10^{-6}$ Ωcm at room temperature. This makes it easy to control the amount of heat generated by the electrode with accuracy when the electrode is used as a heater electrode. In particular, in the case where a reduction in the thickness of the substrate-holding apparatus is anticipated, the thickness of the electrode formed on or in the ceramic base is desirably reduced. Accordingly, the electrode is required to have a low resistivity. Although the lower limit of the resistivity of the electrode is not limited, the realistic lower limit thereof is considered to foe $5 \times 10^{-6}$ Ωcm.

The electrode may include, in addition to metal ruthenium, at least one selected from a filler component, a metal element other than ruthenium, and an alloy containing ruthenium and a metal other than ruthenium. In such a case, it is preferable to add the filler component, the metal element other than ruthenium, and the alloy containing ruthenium and a metal other than ruthenium to the electrode such that the absolute value of the difference in the thermal expansion coefficient over the range of 40° C. to 1200° C. between the ceramic base and the electrode is reduced. The absolute value of the above-described difference is preferably 1.0 ppm/K or less. In such a case, the difference in the thermal expansion coefficient determined over the range of 40° C. to 1200° C. between the ceramic base and the electrode is negligibly small. This reduces the warpage of the ceramic structure to a negligible level even when the thickness of the ceramic structure is small.

The filler component is preferably at least one selected from zirconia, titanium nitride, and the substance that is the principal component of the ceramic base. Since zirconia has a thermal expansion coefficient of 12 to 12.5 ppm/K over the range of 40° C. to 1200° C., it is suitably used as a filler component for increasing the thermal expansion coefficient of the electrode. That is, adding only a small amount of zirconia to the electrode increases the thermal expansion coefficient of the electrode. Furthermore, since zirconia does not react or highly unreactive with metal ruthenium even at high temperatures, it does not significantly affect the resistivity of metal ruthenium. Thus, zirconia is preferable also in this regard. Since the thermal expansion coefficient of titanium nitride over the range of: 40° C. to 1200° C. is 9 co 9.5 ppm/K, titanium nitride is suitably used as a filler component for increasing the thermal expansion coefficient of the electrode. Since titanium nitride is a conducting substance, it is suitably used as a filler component for limiting the resistivity of the electrode to be low. Since titanium nitride does not react or highly unreactive with metal ruthenium even at high temperatures, it does not significantly affect the resistivity of metal ruthenium. Thus, titanium nitride is preferable also in this regard. Adding the substance that is the principal component of the ceramic base to the electrode reduces the difference in thermal expansion coefficient between the electrode and the ceramic base. It should be noted that, although MgO, which has a high thermal expansion coefficient, may also be used as a filler component, it reacts with alumina at high temperatures to form spinel in the case where the principal component of the ceramic base is alumina. Spinel has a thermal expansion coefficient comparable to that of alumina and as high an insulating property as alumina. Moreover, the volume of spinel inducted in the electrode is larger than the volume of MgO added to the electrode.

The metal other than, ruthenium is preferably at least one selected from titanium, and niobium. Since titanium and niobium have a higher thermal expansion coefficient than ruthenium, they are suitably used as an additive for increasing the thermal expansion coefficient of the electrode. Since titanium and niobium are components having conductivity, they are suitably used as an additive for limiting the resistivity of the electrode to be low. Furthermore, titanium and niobium have low magnetic susceptibility. This eliminates the risk of the ceramic structure adversely affecting the magnetic field when the ceramic structure is used for a magnetron device that uses the magnetic field.

The alloy containing ruthenium and a metal other than ruthenium is preferably a Ru—Al alloy. Since the thermal expansion coefficient of a Ru—Al alloy over the range of 40° C. to 1200° C. is about 11 ppm/K, which is higher than that of ruthenium, a Ru—Al alloy is suitably used as an additive for increasing the thermal expansion coefficient of the electrode. Since a Ru—Al alloy has a high conductivity, it is suitably used as an additive for limiting the resistivity of the electrode to be low. For adding such an alloy to the electrode, the other metal that is to be alloyed with ruthenium may be added to ruthenium in an amount determined in expectation of the other metal being alloyed with ruthenium at the time of firing.

The resistivity of the electrode at room temperature is preferably $3.0 \times 10^{-5}$ Ωcm or less. This makes it easy to control the amount of heat generated by the electrode with accuracy when the electrode is used as a heater electrode. Therefore, it is preferable to add the filler component, the metal other than, ruthenium, and the alloy containing ruthenium and a metal other than ruthenium to metal ruthenium such that the resistivity of the resulting electrode at room temperature falls within the above range. In the case where the electrode is used as a heater electrode, the resistivity of the electrode at room temperature is more preferably $2.5 \times 10^{-5}$ Ωcm or less and is further preferably $2.0 \times 10^{-5}$ Ωcm or less.

Figure 2:
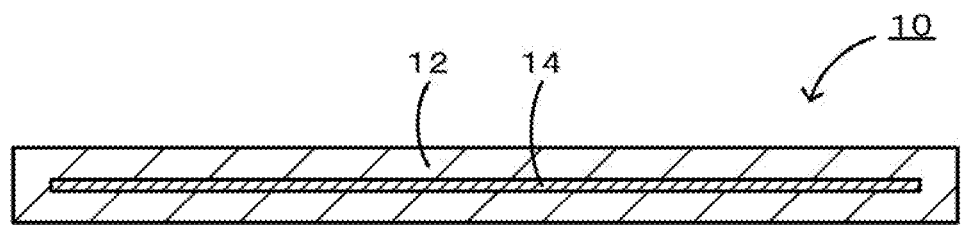
FIG. 2 is a cross-sectional view of FIG. 1 taken along Line A-A.
Figure 3A:
FIGS. 3A to 3D illustrate a method for producing the ceramic structure 10.
Figure 3B:
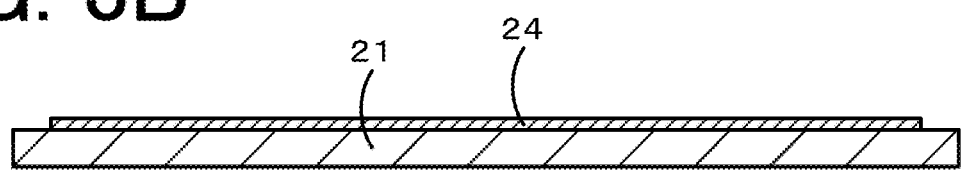
Figure 3C:
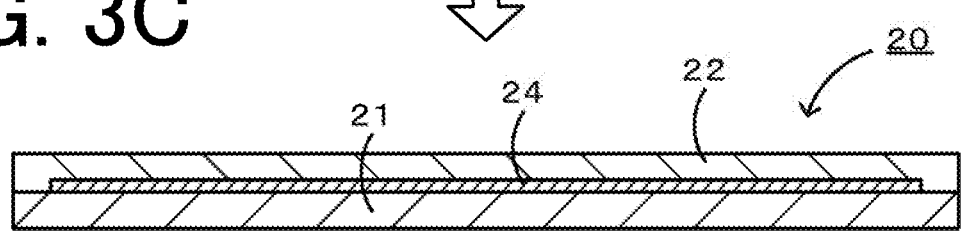
Figure 3D:
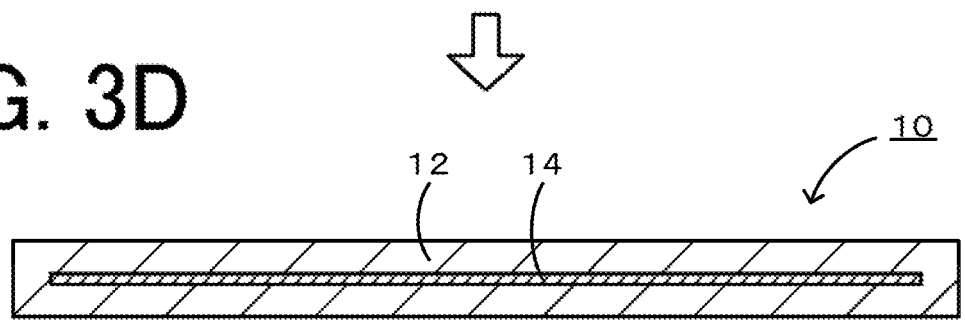

FIGS. 1 and 2 illustrate a ceramic structure according to an embodiment of the present invention. FIG. 1 is a perspective view of: a ceramic structure 10. FIG. 2 is a cross-sectional view of the ceramic structure 10 taken along Line A-A. The ceramic structure 10 includes a discoid ceramic base 12 and an electrode 14 buried in the ceramic base 12. The ceramic base 12 is a sintered body composed principally of alumina or a rare-earth metal oxide and has a thermal expansion coefficient of 7.5 to 9.5 ppm/K over the range of 40° C. to 1200° C. The electrode 14 is composed principally of metal ruthenium. The electrode 14 may be formed in the shape of a sheet. Alternatively, the electrode 14 may be patterned in the manner of a one-stroke sketch so as to extend over the entire cross section of the ceramic base 12. The ceramic structure 10 may include a plurality of electrodes formed in the shape of a sheet or in a specific pattern. FIGS. 3A to 3D illustrate an example method for producing the ceramic structure 10. In this production method, first, a ceramic sintered body that serves as a first base 21 is prepared (see, FIG. 3A). An electrode pattern 24 is formed on the upper surface of the first base 21 (see, FIG. 3B). A ceramic compact that serves as a second base 22 is stacked on the first base 21 so as to cover the electrode pattern 24. Thus, a laminated body 20 is formed (see, FIG. 3C). The laminated body 20 is fired by hot pressing. By hot-press firing, the first, and second bases 21 and 22 are merged with each other into one piece, which serves as a ceramic base 12, and the electrode precursor 24 is converted into an electrode 14. Thus, the ceramic structure 10 is formed (see, FIG. 3D). In the case where the first and second bases 21 and 22 are composed principally of alumina, the firing temperature at which hot-press firing is performed is preferably set to 1500° C. or less (e.g., 1100° C. or more and 1500° C. or less.). In the case where the first and second bases 21 and 22 are composed principally of a rare-earth metal oxide, the firing temperature at which hot-press firing is performed is preferably set to 1600° C. or less (e.g., 1400° C. or more and 1600° C. or less). In the above production method, the first base 21 may be a ceramic compact or a calcined ceramic body. The second base 22 may be a calcined ceramic body or a sintered ceramic body. In the case where the electrode 14 does not change while being fired by hot pressing, the electrode, precursor 24 is the same as the electrode 14. Using the ceramic structure 10 or the laminated body 20 instead of the first base 21 enables a ceramic structure including multiple layers of electrodes to be formed. Although the ceramic structure 10 described above as an example includes an electrode 14 buried in a ceramic base 12, the electrode 14 may alternatively be disposed on the surface of the ceramic base 12.

International Publication No. 2013/54806 discloses a ceramic structure constituted by a ceramic base composed principally of an Mg(Al)O(N) phase including magnesium oxide and Al and N components that are dissolved in magnesium oxide and by an electrode buried in the ceramic base. The electrode described in this document is composed of a mixture of metal ruthenium with MgO. Since the ceramic base described in this document is composed principally of the Mg(Al)O(N) phase, it has a thermal expansion coefficient of 10.2 to 12.8 ppm/K. Thus, the ceramic structure disclosed in the above document differs from the ceramic structure according to the present invention in this regard. In addition, a large amount of MgO is added to metal ruthenium constituting the electrode in order to match the thermal expansion coefficient of the electrode with that of the ceramic base. Since MgO is an insulating material, the electrode containing a large amount of MgO has a high resistivity. Accordingly, in the case where the above electrode is used as a heater electrode, it becomes necessary to, for example, increase the cross-sectional area of the electrode. This may reduce the accuracy with which the amount of heat generated by the electrode is controlled. Furthermore, it becomes necessary to apply a high voltage to the heater. This requires, for example, a considerably high power of a power supply used for controlling the heater.

The member for a substrate-holding apparatus according to the present invention includes the above-described ceramic structure. Examples of the member for a substrate-holding apparatus include a member included in an apparatus that holds a substrate used for semiconductors, such as a Si substrate, a SiC substrate, or a GaN substrate; and a member included in an apparatus that holds a glass substrate used for lighting equipment or displays.

EXAMPLES

Examples of the present invention are described below. Examples below do not limit the scope of the present invention. Note that, when referring to purity and the content of impurities, "%" means % by mass.

(1) Method for Producing Ceramic Structure (1-1) Preparation of First Base (1-1-1) Preparation of Raw Material Powder The $Al_2O_3$ powder used, was a commercially available, high-purity $Al_2O_3$ powder (purity: 99.99% or more, average particle diameter: 0.5 µm). The sintering aids used for sintering an $Al_2O_3$ compact were a $MgF_2$ powder and a MgO powder. The $MgF_2$ powder used was a powder prepared by pulverizing a commercially available $MgF_2$ powder (purity: 99.9% or more) to have an average particle diameter of 1 µm or less. The MgO powder used was a commercially available MgO powder (purity: 99.95% or more, average particle diameter: 1 µm). The amounts of $MgF_2$ powder and MgO powder used were 0.3% and 0.1% by mass, respectively, of the amount (100 mass %) of $Al_2O_3$. The $Al_2O_3$ powder, the $MgF_2$ powder, and the MgO powder were weighed in the proportions described above and subsequently mixed with one another for 4 hours by wet blending using isopropyl alcohol as a solvent in a nylon pot with $Al_2O_3$ stones having a diameter of 5 mm. Thus, a slurry was formed. The slurry was removed from the pot and subsequently dried at 110° C. under a stream of nitrogen. The dried residue was screened through a 30-mesh sieve. The powder that passed through the sieve was used as a raw material powder for preparing a first base ($Al_2O_3$ sintered body).

(1-1-2) Preparation of Discoid Compact

The raw material powder was formed into a discoid compact having a diameter of about 50 mm and a thickness, of about 20 mm by uniaxial pressing at a pressure of 200 kgf/cm$^2$.

(1-1-3) Firing of Discoid Compact

The discoid compact was placed in a hot-press mold made of graphite. The mold was placed in a hot-press furnace and maintained at a firing temperature (maximum temperature) of 1200° C. for 4 hours at a pressing pressure of 200 kgf/cm$^2$. Thus, a sintered body was prepared. Heating and cooling were performed at a rate of 300° C./hr. Vacuum drawing was performed while the temperature was increased to 1000° C. and, after the temperature had reached 1000° C., a nitrogen gas was introduced to the furnace. The pressure of the gas introduced to the furnace was maintained to be about 1.5 atm. For reducing the temperature, temperature control was stopped at 1000° C. and furnace cooling was performed. The resulting sintered body was worked into a shape having a diameter of about 50 mm and a thickness of about 10 mm. Thus, an $Al_2O_3$ sintered body used as a first base was prepared.

The above descriptions are directed to the $Al_2O_3$ sintered bodies used as a first base in Experimental examples 1 to 8 and 10 to 30. In Experimental example 9, an $Al_2O_3$ calcined body was used as a first base. The $Al_2O_3$ calcined body was prepared by heating a discoid compact prepared as in 1-1-2 at 900° C. in an argon atmosphere and subsequently adjusting the shape of the compact to a shape having a diameter of about 50 mm and a thickness of about 20 mm. The first bases used in Experimental examples 31 and 32 were a $Y_2O_3$ sintered body and a $Yb_2O_3$ sintered body, respectively, which were prepared in the following manner. The $Y_2O_3$ sintered body used in Experimental example 31 was prepared as in (1-1) above, except that a commercially available, high-purity $Y_2O_3$ powder was used and the firing temperature was set to 1575° C. The $Yb_2O_3$ sintered body used in Experimental example 32 was prepared as in (1-1) above, except that a commercially available, high-purity $Yb_2O_3$ powder was used and the firing temperature was set to 1500° C. The $Y_2O_3$ powder and the $Yb_2O_3$ powder used had a purity of 99.9% or more and an average particle diameter of 1 µm or less.

(1-2) Deposition of Electrode Paste

The raw material powder used was a powder prepared by pulverizing a commercially available Ru powder (purity: 99.9%) to have an average particle diameter of about 4 µm. The filler component and the metal component other than Ru introduced to a Ru electrode are described below. Note that, the term "filler component" used herein refers to a component having a low reactivity with Ru and particularly to the case in which a ceramic component was introduced in the present invention. For example, $Al_2O_3$, $ZrO_2$, TiN, $Y_2O_3$, and $Yb_2O_3$ are referred to as "filler component". In contrast, metal components such as Al, Ti, and Nb are collectively referred to as "metal components other than Ru", because they have a higher reactivity with Ru than the ceramic components taken above as examples of the filler component. For example, when Al is added to the electrode, a Ru—Al alloy (molar ratio Ru:Al=1:1) is formed. When Nb is added to the electrode, dissolution of Nb in Ru is clearly confirmed. The $Al_2O_3$, $Y_2O_3$, and $Yb_2O_3$ powders used as a filler component were the same as those used in the preparation of the first base. The $ZrO_2$ powder used was a commercially available powder having a purity of 99.9% and an average particle diameter of 1 µm or less. The TiN powder used was a commercially available powder containing 0.1% or less of impurities excluding oxygen and having an average particle diameter of 0.9 µm. The Al powder used was a commercially available, high-purity Al powder of #500 or less. The Ti powder used was a commercially available powder having a purity of 99.9% and an average particle diameter of 10 µm. The Nb powder used was a commercially available powder having a purity of 99% and an average particle diameter of 20 µm. The Ru powder and the specific one of the filler components and the metal components other than Ru were weighed in the specific proportions as described in Table 1 and mixed with poly(n-butyl methacrylate) used as a binder and butyl carbitol used as an organic solvent. Thus, an electrode paste for printing was prepared.

The electrode paste for printing was printed on a 5-mm wide and 15-mm long region of the upper surface of the sintered body prepared in (1-1-3) above through a screen (Experimental examples 1 to 8 and 10 to 32). The thickness of the electrode paste printed was 50 to 100 µm. After the printing, the electrode paste printed was dried at 100° C. for 1 hour in the air. In Example 9, where a compact prepared by heating a discoid compact formed of a mixed powder at 900° C. in an inert atmosphere was used as a first base, the electrode paste was printed on a surface of the compact.

(1-3) Stacking of Second Base

A second base was stacked on a surface of the first base prepared in (1-2) above on which the electrode paste was printed. Thus, a laminated body was formed. In Experimental examples 1 to 9 and 11 to 30, the $Al_2O_3$ compact prepared in (1-1-2) above was used as a second base. In Experimental example 10, the $Al_2O_3$ sintered body prepared in (1-1-3) above was used as a second base. In Experimental examples 31 and 32, the compacts that had not been fired to form the $Y_2O_3$ sintered body and the $Yb_2O_3$ sintered body described in (1-1-3) above were used as a second base.

(1-4) Firing and Merging

The laminated body prepared in (1-3) above was placed in a hot-press furnace and fired by hot pressing under basically the same conditions as in (1-1-3) above in order to convert the laminated body into one piece. Thus, a ceramic structure that included a ceramic base and a sintered electrode buried in the ceramic base was prepared. The firing temperature (maximum temperature) was changed in each of Experimental examples as shown in Table 1.

TABLE 1

| | Ceramic Base | | | Electrode | | | | | Difference in Thermal Expansion Coefficient between Ceramic Base and Electrode |ppm/K| | Resistivity of Electrode (Ω cm) | Remarks |
|---|---|---|---|---|---|---|---|---|---|---|---|
| | First Base (Topside) | Second Base (Downside) | Thermal Expansion Coefficient (ppm/K) | Amount of Ru (Vol %) | Filler Component or Metal Component | | Thermal Expansion Coefficient (ppm/K) | Expansion Coefficient of Electrode (ppm/K) | Firing Temperature (° C.) | | | |
| | | | | | Additive Component | Additive Amount (Vol %) | | | | | | |
| Experimental Example 1 | $Al_2O_3$ Sintered Body | $Al_2O_3$ Compact | 8.6 | 100 | Not Added | 0 | — | 7.9 | 1200 | 0.7 | 1.3E−05 | |
| Experimental Example 2 | $Al_2O_3$ Sintered Body | $Al_2O_3$ Compact | 8.6 | 90 | $Al_2O_3$ | 10 | 8.6 | 8.0 | 1200 | 0.6 | 1.6E−05 | |
| Experimental Example 3 | $Al_2O_3$ Sintered Body | $Al_2O_3$ Compact | 8.6 | 80 | $Al_2O_3$ | 20 | 8.6 | 8.0 | 1200 | 0.6 | 1.9E−05 | |

TABLE 1-continued

|  | Ceramic Base | | | Electrode | | | | | Difference in Thermal Expansion Coefficient between Ceramic Base and Electrode \|ppm/K\| | Resistivity of Electrode (Ω cm) | Remarks |
|  | | | | | Filler Component or Metal Component | | | Thermal | | | | |
|  | First Base (Top-side) | Second Base (Down-side) | Thermal Expansion Coefficient (ppm/K) | Amount of Ru (Vol %) | Additive Component | Additive Amount (Vol %) | Thermal Expansion Coefficient (ppm/K) | Expansion Coefficient of Electrode (ppm/K) | Firing Temperature (° C.) | | | |
|---|---|---|---|---|---|---|---|---|---|---|---|---|
| Experimental Example 4 | $Al_2O_3$ Sintered Body | $Al_2O_3$ Compact | 8.6 | 60 | $Al_2O_3$ | 40 | 8.6 | 8.2 | 1200 | 0.4 | 2.8E−05 | |
| Experimental Example 5 | $Al_2O_3$ Sintered Body | $Al_2O_3$ Compact | 8.6 | 80 | $Al_2O_3$ | 20 | 8.6 | 8.0 | 1300 | 0.6 | 1.6E−05 | |
| Experimental Example 6 | $Al_2O_3$ Sintered Body | $Al_2O_3$ Compact | 8.6 | 100 | Not Added | 0 | — | 7.9 | 1500 | 0.7 | 1.0E−05 | |
| Experimental Example 7 | $Al_2O_3$ Sintered Body | $Al_2O_3$ Compact | 8.6 | 80 | $Al_2O_3$ | 20 | 8.6 | 8.0 | 1500 | 0.6 | 1.5E−05 | |
| Experimental Example 8 | $Al_2O_3$ Sintered Body | $Al_2O_3$ Compact | 8.6 | 60 | $Al_2O_3$ | 40 | 8.6 | 8.2 | 1500 | 0.4 | 2.1E−05 | |
| Experimental Example 9 | $Al_2O_3$ Calcined Body | $Al_2O_3$ Compact | 8.6 | 80 | $Al_2O_3$ | 20 | 8.6 | 8.0 | 1300 | 0.6 | 1.6E−05 | |
| Experimental Example 10 | $Al_2O_3$ Sintered Body | $Al_2O_3$ Sintered Body | 8.6 | 80 | $Al_2O_3$ | 20 | 8.6 | 8.0 | 1300 | 0.6 | 1.5E−05 | |
| Experimental Example 11 | $Al_2O_3$ Sintered Body | $Al_2O_3$ Compact | 8.6 | 84 | $ZrO_2$ | 16 | 12.2 | 8.6 | 1200 | 0.0 | 1.8E−05 | |
| Experimental Example 12 | $Al_2O_3$ Sintered Body | $Al_2O_3$ Compact | 8.6 | 84 | $ZrO_2$ | 16 | 12.2 | 6.6 | 1300 | 0.0 | 1.5E−05 | |
| Experimental Example 13 | $Al_2O_3$ Sintered Body | $Al_2O_3$ Compact | 8.6 | 78 | $ZrO_2$ | 22 | 12.2 | 8.8 | 1300 | 0.2 | 1.7E−05 | |
| Experimental Example 14 | $Al_2O_3$ Sintered Body | $Al_2O_3$ Compact | 8.6 | 90 | TiN | 10 | 9.4 | 8.1 | 1200 | 0.5 | 1.4E−05 | |
| Experimental Example 15 | $Al_2O_3$ Sintered Body | $Al_2O_3$ Compact | 8.6 | 70 | TiN | 30 | 9.4 | 8.4 | 1200 | 0.2 | 1.8E−05 | |
| Experimental Example 16 | $Al_2O_3$ Sintered Body | $Al_2O_3$ Compact | 8.6 | 89 | Al | 11 | 10.8* | 8.4 | 1150 | 0.2 | 1.8E−05 | 18 vol % of RuAl |
| Experimental Example 17 | $Al_2O_3$ Sintered Body | $Al_2O_3$ Compact | 8.6 | 95 | Al | 5 | 10.9* | 8.1 | 1200 | 0.5 | 1.5E−05 | 8 vol % of RuAl |
| Experimental Example 18 | $Al_2O_3$ Sintered Body | $Al_2O_3$ Compact | 8.6 | 89 | Al | 11 | 10.9* | 8.4 | 1200 | 0.2 | 1.7E−05 | 18 vol % of RuAl |
| Experimental Example 19 | $Al_2O_3$ Sintered Body | $Al_2O_3$ Compact | 8.6 | 82 | Al | 18 | 10.9* | 8.8 | 1200 | 0.2 | 1.9E−05 | 30 vol % of RuAl |
| Experimental Example 20 | $Al_2O_3$ Sintered Body | $Al_2O_3$ Compact | 8.6 | 95 | Al | 5 | 10.9* | 8.1 | 1300 | 0.5 | 1.2E−05 | 8 vol % of RuAl |

TABLE 1-continued

| | Ceramic Base | | | Electrode | | | | | Difference in Thermal Expansion Coefficient between Ceramic Base and Electrode \|ppm/K\| | Resistivity of Electrode (Ω cm) | Remarks |
|---|---|---|---|---|---|---|---|---|---|---|---|
| | First Base (Topside) | Second Base (Downside) | Thermal Expansion Coefficient (ppm/K) | Amount of Ru (Vol %) | Filler Component or Metal Component | | Thermal Expansion Coefficient of Electrode (ppm/K) | Firing Temperature (° C.) | | | |
| | | | | | Additive Component | Additive Amount (Vol %) | Thermal Expansion Coefficient (ppm/K) | | | | | |
| Experimental Example 21 | Al$_2$O$_3$ Sintered Body | Al$_2$O$_3$ Compact | 8.6 | 89 | Al | 11 | 10.9* | 8.4 | 1300 | 0.2 | 1.3E−05 | 18 vol % of RuAl |
| Experimental Example 22 | Al$_2$O$_3$ Sintered Body | Al$_2$O$_3$ Compact | 8.6 | 82 | Al | 18 | 10.9* | 8.8 | 1300 | 0.2 | 1.4E−05 | 30 vol % of RuAl |
| Experimental Example 23 | Al$_2$O$_3$ Sintered Body | Al$_2$O$_3$ Compact | 8.6 | 91 | Ti | 9 | 12.9 | 8.4 | 1200 | 0.2 | 1.5E−05 | |
| Experimental Example 24 | Al$_2$O$_3$ Sintered Body | Al$_2$O$_3$ Compact | 8.6 | 86 | Ti | 14 | 12.9 | 8.6 | 1200 | 0.0 | 1.6E−05 | |
| Experimental Example 25 | Al$_2$O$_3$ Sintered Body | Al$_2$O$_3$ Compact | 8.6 | 81 | Ti | 19 | 12.9 | 8.9 | 1200 | 0.3 | 1.7E−05 | |
| Experimental Example 26 | Al$_2$O$_3$ Sintered Body | Al$_2$O$_3$ Compact | 8.6 | 91 | Ti | 9 | 12.9 | 8.4 | 1300 | 0.2 | 1.3E−05 | |
| Experimental Example 27 | Al$_2$O$_3$ Sintered Body | Al$_2$O$_3$ Compact | 8.6 | 86 | Ti | 14 | 12.9 | 8.6 | 1300 | 0.0 | 1.4E−05 | |
| Experimental Example 28 | Al$_2$O$_3$ Sintered Body | Al$_2$O$_3$ Compact | 8.6 | 81 | Ti | 19 | 12.9 | 8.9 | 1300 | 0.3 | 1.5E−05 | |
| Experimental Example 29 | Al$_2$O$_3$ Sintered Body | Al$_2$O$_3$ Compact | 8.6 | 90 | Nb | 10 | 9.3 | 8.0 | 1200 | 0.6 | 3.1E−05 | |
| Experimental Example 30 | Al$_2$O$_3$ Sintered Body | Al$_2$O$_3$ Compact | 8.6 | 70 | Nb | 30 | 9.3 | 8.3 | 1200 | 0.3 | 1.6E−04 | |
| Experimental Example 31 | Y$_2$O$_3$ Sintered Body | Y$_2$O$_3$ Compact | 8.5 | 80 | Y$_2$O$_3$ | 20 | 8.5 | 8.0 | 1575 | 0.5 | 1.4E−05 | |
| Experimental Example 32 | Yb$_2$O$_3$ Sintered Body | Yb$_2$O$_3$ Compact | 8.3 | 80 | Yb$_2$O$_2$ | 20 | 8.3 | 8.0 | 1500 | 0.3 | 1.4E−05 | |
| Experimental Example 33 | Al$_2$O$_3$ Sintered Body | Al$_2$O$_3$ Compact | 8.6 | 86 | Al | 14 | 10.9* | 8.6 | 1300 | 0.0 | 1.3E−05 | 23 vol % of RuAl |
| Experimental Example 34 | Al$_2$O$_3$ Sintered Body | Al$_2$O$_3$ Compact | 8.6 | 86 | Al | 14 | 10.9* | 8.6 | 1500 | 0.0 | 1.1E−05 | 23 vol % of RuAl |

*applying the thermal expansion coefficient of RuAl generated by the reaction between Ru and Al (2) Ceramic Structure Evaluation Items Thermal Expansion Coefficients of Components The thermal expansion coefficient of Ru was determined in accordance with JIS-R1618 by measuring a sintered body prepared from a pulverized Ru powder. Since attention is focused, herein on the strain, resulting from a mismatch of thermal expansion coefficient between the ceramic base and the electrode which occurs when the ceramic base and the electrode paste are merged into one piece by firing, thermal expansion coefficient over the range of 40° C. to 1200° C. was determined (the minimum firing temperature among Experimental examples 1 to 30 was 1200° C.). It is considered that, in the case where a structure is prepared with a firing temperature exceeding 1200° C., a load applied to a ceramic material by hot pressing under such a high temperature may cause not only a metal electrode material composed principally of Ru but also a ceramic material to undergo plastic deformation by a certain degree, which reduces the strain resulting from the mismatch of thermal expansion coefficient or the like. Accordingly, the temperature range in which thermal expansion coefficient was determined was set to 40° C. to 1200° C. The thermal expansion coefficient of $Al_2O_3$ was determined by measuring an $Al_2O_3$ sintered body sample taken from the $Al_2O_3$ ceramic base in accordance with JIS-R1618. The thermal expansion coefficient of the $Al_2O_3$ filler was considered to foe the same as that of $Al_2O_3$. The thermal expansion coefficients of the filler components and the metals other than Ru were determined with reference to literature values or by measuring a sintered body prepared as in the measurement of $Al_2O_3$ in accordance with JIS-R1618. Table 1 summarizes the thermal expansion coefficients of the above components.

Thermal Expansion Coefficient of Electrode

The thermal expansion coefficient of each electrode over the range of 40° C. to 1200° C. was determined by calculation based on the thermal expansion coefficient of each of the components included in the electrode over the range of 40° C. to 1200° C. and the proportions of the components in the electrode. Table 1 summarizes the results.

Difference in Thermal Expansion Coefficient

The absolute value of the difference in the thermal expansion coefficient over the range of 40° C. to 1200° C. between the ceramic base and the electrode was calculated.

Resistivity of Electrode

A rectangular specimen having a width of about 9 mm, a length of about 9 mm, and a thickness of about 6 mm was taken from the ceramic structure such that a portion of the electrode having a width of about 5 mm and a length of about 9 mm was buried at the center of the specimen. The 5-mm wide end surfaces of the electrode were exposed at the respective end surfaces of the specimen. The cross-sectional area S ($cm^2$) of the end surfaces of the electrode was determined by measuring the width and thickness of the electrode with a microscope. The length L (cm) of the electrode was measured with vernier calipers and used for calculating the resistivity of the electrode. A circuit for measuring resistivity was prepared for applying a conductive paste onto both end surfaces of the electrode and attaching a lead wire to each of the end surfaces of the electrode. While a minute current I (mA), which was changed in the range of 0 to 150 mA, was applied to the circuit at room temperature in the air, the minute voltage V (mV) generated was measured. The resistance $R(\Omega)$ of the electrode was determined by R=V/I. The electric resistivity $\rho$ ($\Omega$cm) of the electrode was calculated by $\rho = R \times S/L$.

Microstructure

A cross section of the member was mirror-polished and inspected with a scanning electron microscope (SEM) and, an electron probe microanalyzer (EPMA) for microstructure at the interface between the electrode and the ceramic base and in the vicinity of the interface.

Density and Open Porosity of Sintered Body

A rod-like sample was taken from the sintered body and subjected to a measurement by an Archimedes method in which pure water was used as a medium.

(3) Results of Evaluations of Ceramic Structure

The results of the evaluations made in each of Experimental examples are described below.

Experimental Example 1

In Experimental example 1, a ceramic structure was prepared by firing a laminated body including an $Al_2O_3$ compact (second base), a 100%-Ru electrode, and an $Al_2O_3$ sintered body (first base), which were stacked on top of one another in this order from top, at 1200° C. for 4 hours by hot pressing. The difference in thermal expansion coefficient between the ceramic base and the electrode was 0.7 ppm/K, that is, small. The results of the inspection of cross section confirmed that no defects such as cracking occurred at the interface or in the vicinity of, the interface. The resistivity of the electrode was $1.3 \times 10^{-5}$ $\Omega$cm, that is, markedly low. This confirms that the electrode can be suitably used as a heater electrode. The $Al_2O_3$ sintered bodies taken from the first and second bases had a bulk density of 3.97 $g/cm^3$ or more and an open porosity of 0.02% or less, that is, sufficiently high denseness.

Experimental Examples 2 to 4

In Experimental example 2, the member was prepared under the same conditions as in Experimental example 1, except that an $Al_2O_3$ filler was added to the electrode such that the composition of the electrode contained 90 vol % of Ru and 10 vol % of $Al_2O_3$. In Experimental examples 3 and 4, a larger amount of $Al_2O_3$ filler than in Experimented example 2 was added to the electrode. Since the $Al_2O_3$ filler has a higher thermal expansion coefficient than Ru, the larger the amount of $Al_2O_3$ filler added to the electrode, the higher the thermal expansion coefficient of the electrode, that is, the closer to the thermal expansion coefficient of the $Al_2O_3$ base. In these examples, the thermal expansion coefficient of the electrode was 8.0 to 8.2 ppm/K, and the difference in thermal expansion coefficient between the electrode and $Al_2O_3$ was reduced to 0.6 to 0.4 ppm/K. Although the resistivity of the electrode was $1.6 \times 10^{-5}$ to $2.8 \times 10^{-5}$ $\Omega$cm and increased with an increase in the amount of filler added to the electrode, the electrode had a markedly low resistivity of $2.8 \times 10^{-5}$ $\Omega$cm even in Experimental example 4, where the amount of filler added to the electrode was 40 vol %. Moreover, similarly to Experimental example 1, no defects such as cracking occurred at the interface between the electrode and the ceramic base or in the vicinity of the interface. Furthermore, the $Al_2O_3$ base had sufficiently high denseness.

Experimental Examples 5 to 8

In Experimental examples 5 to 8, a ceramic structure was prepared as in Experimental example 2, except that the amount of $Al_2O_3$ filler added to the electrode and the firing temperature were changed. In Experimental example 5, where the amount of $Al_2O_3$ filler was set to 20 vol % and firing was performed at 1300° C., the electrode suitably had a resistivity of $1.6 \times 10^{-5}$ $\Omega$cm, which was slightly lower than that of a material that had the same composition as the electrode of Experimental example 5 and was fired at 1200° C. (Experimental example 3). In Experimental example 6, where an $Al_2O_3$ filler was not added to the electrode and firing was performed at 1500° C., the electrode had a resistivity of $1.0 \times 10^{-5}$ $\Omega$cm, which was the lowest among Experimental, examples 1 to 30. In Experimental examples 7 and 8, where the amounts of $Al_2O_3$ filler added to the electrode was 20 and 40 vol %, respectively, the electrode suitably had resistivities of $1.5 \times 10^{-5}$ and $2.1 \times 10^{-5}$ $\Omega$cm, respectively. Moreover, in any case of Experimental examples 5 to 8, similarly to Experimental example 1, no defects such as cracking occurred at the interface between the electrode and the ceramic base or in the vicinity of the interface. Furthermore, the $Al_2O_3$ base had sufficiently high denseness. A comparison between the results obtained in Experimental examples 6 to 8 and the results obtained in Experimental examples 1, 3, and 4 confirms that the resistivity of the electrode was lower in Experimental examples 6 to 8, where the sintering temperature was 1500° C., than Experimental examples 1, 3, and 4, where the sintering temperature was 1200° C. This is presumably because the sintering of the electrode was promoted and the sizes of the grains were increased at 1500° C., which reduced the resistance at the grain boundaries.

Experimental Examples 9 and 10

A ceramic structure was prepared as in Experimental example 5, except that an $Al_2O_3$ calcined body was used as a first base in Experimental example 9 and $Al_2O_3$ sintered body was used as a second base in Experimental example 10. In Experimental examples 9 and 10, the electrode suitably had low resistivities of $1.6 \times 10^{-5}$ and $1.5 \times 10^{-5}$ $\Omega$cm, respectively. When a calcined body is used as a first base as in Experimental example 9, the number of times firing needs to be performed at a high temperature (main, firing) for preparing a ceramic structure can be reduced to one. This advantageously reduces the number of steps of the manufacturing process. When a sintered body is used as a second base as in Experimental example 10, the flatness of the surface of the electrode can be further enhanced. Consequently, when the ceramic structure prepared in Experimental example 10 is used as a ceramic heater that holds a wafer thereon, the thermal uniformity of the ceramic heater may be further enhanced.

Experimental Examples 11 to 13

In Experimental example 11, a ceramic structure was prepared as in Experimental example 2, except that $ZrO_2$ was used as a filler. The thermal expansion coefficient of $ZrO_2$ was estimated to be 12.2 ppm/K with reference to literature values. Since $ZrO_2$ has a high thermal expansion coefficient, adding 16 vol % of $ZrO_2$ to the electrode enabled the difference in thermal expansion coefficient to be reduced to 0.0 ppm/K in Experimental example 11. That is, the thermal expansion coefficient of the electrode could be accurately matched with that of the $Al_2O_3$ base. In Experimental example 12, where a ceramic structure was prepared as in Experimental example 11 except that the firing temperature was set to 1300° C., the ceramic structure had a thermal expansion, coefficient that accurately matched with that of the $Al_2O_3$ base. In Experimental example 13, a ceramic structure was prepared as in Experimental example 11, except that the amount of $ZrO_2$ added to the electrode was set to 22 vol % and the firing temperature was set to 1300° C. In Experimental example 13, the thermal expansion coefficient of the electrode was set to be higher than that, of $Al_2O_3$. In any case of Experimental examples 11 to 13, no defects such as cracking occurred at the interface between the electrode and the ceramic base or in the vicinity of the interface. Furthermore, the $Al_2O_3$ base had sufficiently high denseness. Moreover, the electrode suitably had a low resistivity of $1.5 \times 10^{-5}$ to $1.8 \times 10^{-5}$ $\Omega$cm.

Experimental Examples 14 and 15

In Experimental example 14, a ceramic structure was prepared as in Experimental example 2, except that TiN was used as a filler. In Experimental example 15, a ceramic structure was prepared as in Experimental example 14, except that the amount of TiN added to the electrode was set to 30 vol %. The thermal expansion coefficient of TIN determined by measuring a sintered body was 9.4 ppm/K. Since TiN is a conducting substance, the electrode prepared in Experimental example 14 had a resistivity of $1.4 \times 10^{-5}$ $\Omega$cm, which was lower than that of the electrode prepared in Experimental example 2, which included the same amount of $Al_2O_3$ filler as in Experimental example 14. The electrode prepared in Experimental example 15 had a resistivity of $1.8 \times 10^{-5}$ $\Omega$cm, which was lower than that of the electrode prepared in Experimental example 3, where the amount of $Al_2O_3$ filler used was 20 vol %, that is, small. In any case of Experimental examples 14 and 15, no defects such as cracking occurred at the interface between the electrode and the ceramic base or in the vicinity of the interface. Furthermore, the $Al_2O_3$ base had sufficiently high denseness.

Experimental Examples 16 to 22

In Experimental examples 16 to 22, a metal component Al was added, to Ru in order to control the thermal expansion coefficient of the electrode. A Ru—Al alloy was formed inside the electrode due to the reaction between Al and Ru and, as a result, a Eu/Ru—Al electrode was prepared. The method for preparing a ceramic structure was basically the same as in Experimental example 2. The thermal expansion coefficient and the density of a Ru—Al alloy were determined to be 10.9 ppm/K and 7.97 g/cm$^3$, respectively, from the results of the measurement of a sintered body. The amount of Al added to Ru was set on the assumption that the whole amount of Al added to Ru reacts with Ru to form a Ru—Al alloy. The content of Ru—Al alloy in the electrode is shown in the columns "Remarks" of Table 1 in units of vol %. Since a Ru—Al alloy is a material having a high conductivity and a high thermal expansion, coefficient, in Experimental examples 16 to 22, adding a small amount of Al to the electrode made the thermal expansion coefficient of the electrode close to that of the $Al_2O_3$ base and reduced the resistivity of the electrode to $1 \times 10^{-5}$ to $2 \times 10^{-5}$ $\Omega$cm. In particular, in Experimental examples 16, 18, and 21, 11 vol % of Al was added to the electrode and, as a result, 18 vol % of a Ru—Al alloy was formed. This reduced the difference in thermal expansion coefficient between the electrode and the $Al_2O_3$ base to 0.2 ppm/K. In any case of Experimental examples 1.6 to 22, no defects such as cracking occurred at the interface between the electrode and the ceramic base or in the vicinity of the interface. Furthermore, the $Al_2O_3$ base had sufficiently high denseness.

Experimental Examples 23 to 30

In Experimental examples 23 to 28, a metal component Ti was added to the electrode. In Experimental examples 29 and 30, a metal component Nb was added to the electrode. In Experimental examples 23 to 30, a ceramic structure was prepared as in Experimental example 2. In Experimental examples 23 to 30, it was possible to make the thermal expansion coefficient of the electrode close to that of the $Al_2O_3$ base. Furthermore, since Ti and Nb have a high thermal expansion coefficient and are conducting components, an electrode having a low resistivity was formed. In particular, in Experimental examples 24 and 27, it was possible to accurately match the thermal expansion coefficient of the electrode with that of the $Al_2O_3$ base. Ti and Nb are components that easily dissolve in Ru. The results of an element distribution analysis of the electrode by EPMA confirmed that, in particular, Nb spread widely in Ru. The electrode had a low resistivity of $1\times10^{-5}$ to $2\times10^{-5}$ Ωcm in Experimental examples 23 to 28, where Ti was added to the electrode. The electrodes including Nb had a slightly higher resistivity than in Experimental examples 23 to 28. Specifically, the resistivity of the electrode prepared in Experimental example 30, where 30 vol % of Nb was added to the electrode, was $1.6\times10^{-4}$ Ωcm. In any case of Experimental examples 23 to 30, no defects such as cracking occurred at the interface between the electrode and the ceramic base or in the vicinity of the interface. Furthermore, the $Al_2O_3$ base had sufficiently high denseness.

Experimental Examples 31 and 32

In Experimental examples 31 and 32, where the ceramic base was composed principally of a rare-earth metal oxide, a ceramic structure was prepared as in Experimental example 2, except that the firing temperature was set to 1575° C. and 1500° C., respectively. The thermal expansion coefficient of the ceramic base was determined by measuring a sample taken from the ceramic structure. In each example, 20 vol % of a filler composed of the same material as that of the first base was added to the electrode. The difference in thermal expansion coefficient between the electrode and the ceramic base was 0.3 to 0.5 ppm/K, that is, small. The electrode had a low resistivity of $1.4\times10^{-5}$ in each example. That is, a suitable electrode was prepared. A sample of the ceramic base was taken from each ceramic structure. The $Y_2O_3$ sample had a bulk density of 5.00 g/cm³ or more. The $Yb_2O_3$ sample had a bulk density of 9.17 g/cm³ or more. The $Y_2O_3$ sample and the $Yb_2O_3$ sample had an open porosity of 0.03% or less, that is, high denseness. Furthermore, no defects such as cracking occurred at the interface between the electrode and the ceramic base or in the vicinity of the interface.

Comparative Examples 1 to 5

In Comparative examples 1 to 5, a commonly used electrode was buried in the $Al_2O_3$ base. In each of Comparative examples 1 to 5, a ceramic structure was prepared as in Experimental example 1 by adding a specific amount of $Al_2O_3$ filler to the specific conducting component shown in Table 2. Note that, 5 vol % of Ni or Co was added a sintering aid to the WC electrode. The thermal expansion coefficients of the conducting components are literature values. In any case of Comparative examples 1 to 5, the $Al_2O_3$ base and the electrode had good denseness. However, since the thermal expansion coefficient of the electrode was small, the difference in thermal expansion coefficient between the $Al_2O_3$ base and the electrode was larger than 1 ppm/K although a considerably large amount of $Al_2O_3$ filler was added to the electrode. Furthermore, the addition of the considerably large amount of $Al_2O_3$ filler disadvantageously increased the resistivity of the electrode beyond $3.0\times10^{-5}$ Ωcm.

TABLE 2

| | Ceramic Base | | | Electrode | | | | | Difference in Thermal Expansion Coefficient | | |
| | | | | Conducting Component | | | | | | | |
| | First Base (Topside) | Second Base (Downside) | Thermal Expansion Coefficient (ppm/K) | Name of Substance | Amount (Vol %) | Thermal Expansion Coefficient (ppm/K) | Filler $Al_2O_3$ Additive Amount (Vol %) | Thermal Expansion Coefficient of Electrode (ppm/K) | Firing Temperature (° C.) | between Ceramic Base and Electrode \|ppm/K\| | Resistivity of Electrode (Ω cm) | Remarks |
|---|---|---|---|---|---|---|---|---|---|---|---|---|
| Comparative Example 1 | $Al_2O_3$ Sintered Body | $Al_2O_3$ Compact | 8.6 | WC(Ni) | 60 | 4.7 | 40 | 6.3 | 1200 | 2.3 | 3.5E−05 | |
| Comparative Example 2 | $Al_2O_3$ Sintered Body | $Al_2O_3$ Compact | 8.6 | WC(Co) | 60 | 4.7 | 40 | 6.3 | 1200 | 2.3 | 3.7E−05 | |
| Comparative Example 3 | $Al_2O_3$ Sintered Body | $Al_2O_3$ Compact | 8.6 | W | 70 | 4.9 | 30 | 6.0 | 1200 | 2.6 | 3.1E−05 | |
| Comparative Example 4 | $Al_2O_3$ Sintered Body | $Al_2O_3$ Compact | 8.6 | Mo | 70 | 5.7 | 30 | 6.6 | 1200 | 2.0 | 3.3E−05 | |
| Comparative Example 5 | $Al_2O_3$ Sintered Body | $Al_2O_3$ Compact | 8.6 | Ni | 70 | 6.8 | 30 | 7.3 | 1200 | 1.3 | 4.6E−05 | |

The results obtained in Comparative examples 1 to 5 confirm that it is difficult in the related art to use a ceramic base composed of alumina, a rare-earth metal oxide (e.g., yttria), or the like with a thermal expansion coefficient of 7.5 to 9.5 ppm/K (particularly, 8 to 9 ppm/K) in combination with an electrode having a thermal expansion coefficient higher or lower than that of the ceramic base by 1 ppm/K or less and a low resistivity of $3\times10^{-5}$ Ωcm or less. It is also confirmed that it is extremely difficult to produce a ceramic structure including an electrode having a resistivity of $2.5\times10^{-5}$ Ωm or less or on the order of $1\times10^{-5}$ Ωcm, at which the electrode is capable of achieving further high performance as a heater electrode, and an adequate thermal expansion coefficient. Among the electrodes prepared in Comparative examples, Ni and Co are elements having considerably high magnetic susceptibility. Therefore, it is preferable to avoid the addition of these magnetization-susceptible elements to the electrode as much as possible because, when the ceramic structure is used, in a magnetron device that uses a magnetic field, the magnetic field environment may be adversely affected. The electrodes prepared in Experimental examples 1 to 32 all had low magnetic susceptibility and are not considered to adversely affect the magnetic field.

Experimental Examples 33 and 34

In Experimental example 33, a Ru/Ru—Al electrode was prepared by adding a metal component Al to Ru as in Experimental examples 16 to 22. In Experimental example 33, a ceramic structure was prepared under the same conditions as in Experimental, example 21, except that the amount of Al added to Ru was set to 14 vol %. The properties of the ceramic structure were evaluated. In Experimental example 33, the thermal expansion coefficient of the Ru/Ru—Al electrode was accurately matched, with that of the $Al_2O_3$ base by adding 14 vol % of Al to the electrode, and a suitable $Al_2O_3$ base including an electrode buried therein, in which no cracks or the like were present at the interface between the electrode and $Al_2O_3$, was prepared. The electrode suitably had a low resistivity of $1.3 \times 10^{-5}$ Ωcm. In Experimental example 34, an $Al_2O_3$ base including a Ru/Ru—Al electrode buried therein was prepared as in Experimental example 33, except that only 0.25% by mass of a MgO powder that served as a sintering aid was added to the $Al_2O_3$ powder and the hot-press firing temperature was set to 1500° C. in both preparation of the first base and preparation of the laminated body. In Experimental example 34, the difference in thermal expansion coefficient between $Al_2O_3$ and the electrode material was zero, and a suitable structure in which no cracks were present was prepared. The electrode suitably had a low resistivity of $1.1 \times 10^{-5}$ Ωcm.

The present application claims priority from Japanese Patent Application No. 2014-187868 filed on Sep. 16, 2014, the entire contents of which are incorporated herein by reference.

It is needless to say that Examples above do not limit the scope of the present invention.

What is claimed is:

1. A ceramic structure including a ceramic base being a sintered body composed principally of alumina or a rare-earth metal oxide, and an electrode disposed on the surface of the ceramic base or buried in the ceramic base,
wherein the ceramic base has a thermal expansion coefficient of 7.5 to 9.5 ppm/K over the range of 40° C. to 1200° C.,
the principal component of the electrode is metal ruthenium, and
the electrode includes, in addition to metal ruthenium, at least one metal selected from titanium and niobium or a ruthenium-aluminum alloy.

2. The ceramic structure according to claim 1,
wherein the absolute value of a difference in a thermal expansion coefficient over the range of 40° C. to 1200° C. between the ceramic base and the electrode is 1.0 ppm/K or less.

3. The ceramic structure according to claim 1,
wherein the electrode includes a filler component in addition to metal ruthenium.

4. The ceramic structure according to claim 3, wherein the filler component is at least one selected from zirconia, titanium nitride, and a substance that is the principal component of the ceramic base.

5. The ceramic structure according to claim 1, wherein the resistivity of the electrode at room temperature is $3.0 \times 10^{-5}$ Ωcm or less.

6. A member for a substrate-holding apparatus comprising the ceramic structure according to claim 1.

7. The ceramic structure according to claim 2, wherein the resistivity of the electrode at room temperature is $3.0 \times 10^{-5}$ Ωcm or less.

8. A member for a substrate-holding apparatus comprising the ceramic structure according to claim 2.

9. A method for producing a ceramic structure including:
disposing an electrode or an electrode precursor on a surface of a first base, the principal component of the electrode or the electrode precursor being metal ruthenium, the first base being a compact, a calcined body, or a sintered body, the principal component of the first base being alumina or a rare-earth metal oxide; stacking a second base on the first base so as to form a laminated body, the second base being a compact, a calcined body, or a sintered body, the principal component of the second base being the same oxide as that included in the first base; and firing the laminated body by hot pressing in order to form a ceramic structure,
wherein the first base and the second base have a thermal expansion coefficient of 7.5 to 9.5 ppm/K over the range of 40° C. to 1200° C., and
wherein the electrode or the electrode precursor include, in addition to metal ruthenium, at least one metal selected from titanium and niobium or a ruthenium-alminum alloy.

10. The method for producing a ceramic structure according to claim 9, wherein, when the principal component of the first and second bases is alumina, the hot-press firing is performed at a firing temperature of 1500° C. or less, and
when the principal component of the first and second bases is a rare-earth metal oxide, the hot-press firing is performed at a firing temperature of 1600° C. or less.

* * * * *